Sept. 29, 1953 A. S. HARRIS 2,654,071

FREQUENCY OSCILLATION MODULATOR

Filed July 5, 1951

INVENTOR
A. S. HARRIS
BY R. P. Morris
ATTORNEY

Patented Sept. 29, 1953 2,654,071

UNITED STATES PATENT OFFICE 2,654,071

FREQUENCY OSCILLATION MODULATOR

Albert S. Harris, Fort Wayne, Ind., assignor to Farnsworth Research Corporation, Fort Wayne, Ind., a corporation of Indiana Application July 5, 1951, Serial No. 235,345

7 Claims. (Cl. 332—25)

This invention relates to oscillation generators and more particularly to frequency controllable oscillation generators.

Various forms of frequency variable oscillation generators have been proposed. In most such generators means may be provided to control the phase shift characteristics of a frequency determining circuit in order to control the frequency of oscillation of the oscillator. This may be done by providing, for example, a reactance tube in a tuned circuit of the oscillator or the like.

Circuits have also been proposed wherein the delay in transit time of a cathode ray beam may be used to produce a frequency shift in an applied radio frequency energy for the purpose of frequency modulating such applied energy. It has also been proposed to utilize delay line devices with variable delay effects over which radio frequency energy is passed, to produce frequency or phase modulation.

There has also been proposed a type of oscillator wherein resonant tank circuits are not used but in which the regeneration is effected by providing phase shift networks of such a length that the energy at the desired frequency will be fed back to the input of the system in phase coincidence so that sustained oscillations are produced. This type of oscillation is commonly called a phase shift oscillator.

In accordance with this invention there is provided an oscillation generator of the so-called phase shift type which may utilize a cathode ray beam as part of the phasing feedback path. The beam is directed to have effect at variable points along a delay device with feedback path so that the length of the path and consequently the frequency at which proper phase coincidence feedback will occur, may be varied.

With this in mind the invention may comprise an oscillation generator including a cathode ray tube beam directed toward a target electrode in the form of a delay device with means for providing a regenerative feedback from this delay line to an input grid of the cathode ray tube. The circuit will then oscillate at a frequency determined by the phase shift in the feedback circuit. Deflection means are provided for controlling the position of the electron beam on the delay device to control the oscillation frequency.

In accordance with one feature of this invention a signal source may be applied to deflecting electrodes of the cathode ray tube so that a frequency modulated carrier wave is generated within the system.

In accordance with another feature of this invention the oscillator output frequency may be applied to a frequency discriminator so that departures from a desired center frequency are detected and this detected energy may be applied to the deflection circuits of the cathode ray tube to correct for frequency deviation occurring in the oscillator.

Figure 1:
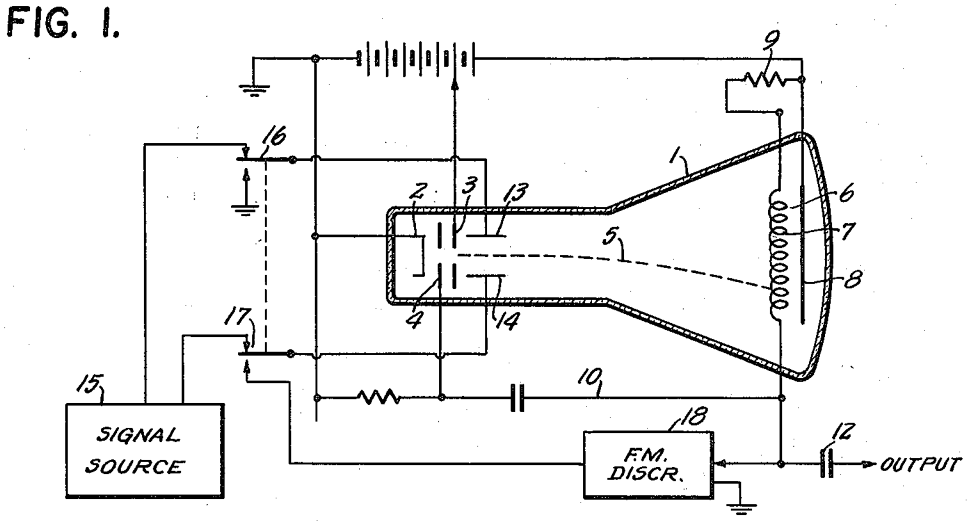
Figure 2:
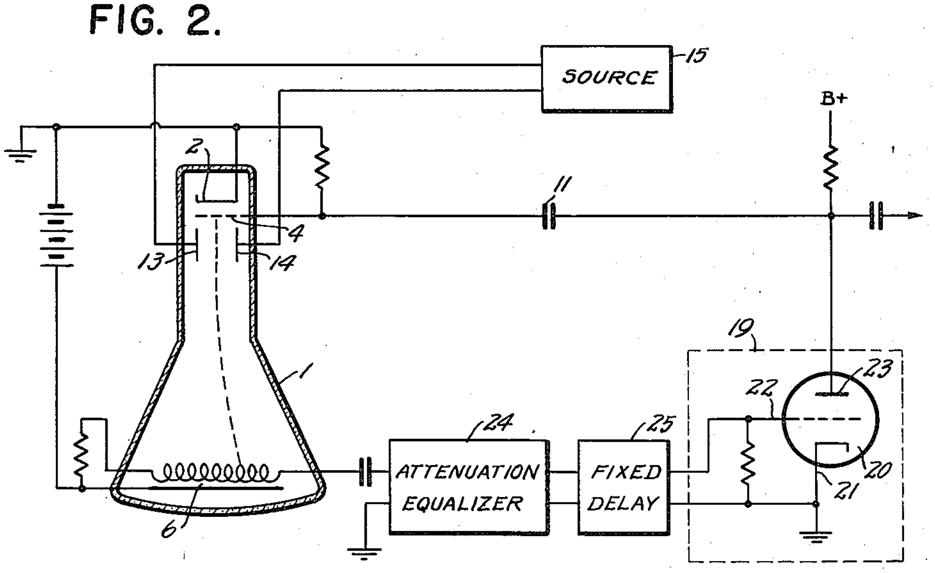

The above-mentioned and other features and objects of this invention and the manner of attaining them will become more apparent and the invention itself will be best understood by reference to the following description of an embodiment of the invention taken in conjunction with the accompanying drawings, in which Figure 1 is a diagrammatic illustration of an oscillator incorporating the features of this invention, and Figure 2 is a schematic diagram of an alternative oscillator circuit incorporating the features of this invention.

Turning first to Fig. 1, there is shown diagrammatically a cathode ray device 1 which may be provided with an emissive cathode 2, the emitted electrons of which are accelerated, by accelerating electrode 3 under control of control electrode 4. From the cathode 2 is produced the cathode ray beam indicated diagrammatically by dotted line 5. This beam is directed toward a delay line 6 which may comprise a helical coil 7 and capacitive plate 8. At one end the coil 7 and 8 may be terminated in an impedance 9 equal to the characteristic impedance of the delay line so that reflection of energy will not occur from that end. At the other end of coil 7 is provided a coupling line 10 which serves to apply energy over coupling condenser 11 to control electrode 4. Thus a phase shift path is provided utilizing beam 5 as a portion of the feedback path and a portion of delay line 6 in this feedback path. The electrodes 2, 3 and 4 of tube 1 serve to produce amplification of energy so that sustained oscillations may be provided which may be applied over coupling condenser 12 to a desired output load. Within tube 1 are provided deflection plates 13, 14 so positioned as to move beam 5 up and down line 6 in accordance with potentials applied to these electrodes. It will thus be seen that means is herein provided adjustably to control the phase shift and hence the frequency output of the energy generated in the oscillator. As shown in Fig. 1 energy from a signal source 15 may be applied over the upper contacts of switches 16, 17 to the deflection plates 13 and 14 to provide a frequency modulation for the output energy.

Alternatively the oscillator may be initially adjusted for operation at a desired frequency. Switches 16, 17 may be then moved to the lower contacts connecting deflection plates 13 and 14 to a frequency discriminator 18. A portion of the output energy from the oscillator is applied to frequency discriminator 18 and hence over switches 16 and 17 to the deflection plates 13 and 14. The frequency discriminator is preferably adjusted in a well known manner to produce output voltages proportional in amplitude and with a polarity dependent upon the departure from center frequency of the oscillation generator. This output energy thus applied to deflection plates 13 and 14 will serve to shift beam 5 along line 6 to a position to compensate for the departure from center frequency so that the desired frequency of operation may be maintained.

In the embodiment illustrated in Fig. 1 operation of the oscillator must depend only on the amplification occurring directly in tube 1. In Fig. 2 is shown an alternative type of circuit utilizing again the same type of tube 1 with delay line 6 and corresponding electrodes 2–4 as well as deflection plates 13 and 14. However in this case the principal amplifier arrangement is comprised by amplifier 19 which may include an electron discharge device 20 having a cathode 21, control electrode 22 and an anode 23. The complete feedback path comprises coupling condenser 11, tube 1, and attenuation equalizer 24 and a fixed delay device 25 whereby the principal phase delay may be constituted by circuit elements other than the delay line 6. In this case the frequency control occurs in essentially the same manner as in the circuit shown in Fig. 1, but since the delay line 6 may be only a small part of the entire phase shift circuit the frequency deviation may be closely limited. The attenuation equalizer 24 should have a characteristic such that attenuation provided increases as the frequency increases to counteract the decreased attenuation around the circuit with increase in frequency. If the variation in frequency is quite large such an equalizer may be desirable in order that the output voltage may be substantially constant despite the variations in frequency of this system. In frequency modulation systems wherein the range is small or in center frequency stabilizing circuits such attenuation equalizers may not be required.

Given the carrier frequency on which the system is to operate and the frequency deviation to be permitted the problem of designing the tube and circuit for operation in this manner will be readily apparent to those skilled in the art.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. An oscillation generator comprising a cathode ray tube having an electron beam source, a beam control grid and a target electrode comprising a delay device arranged to receive the electrons of said beam, said delay device comprising a helically wound coil, and a capacitive member in close proximity to said coil, means for coupling said delay device to said control grid, whereby a regenerative feedback is provided for energy of a frequency determined by the phase shift in the circuit, and means for adjustably controlling the position of said electron beam on said delay device to control the oscillation frequency.

2. An oscillation generator according to claim 1, wherein said means for controlling said beam comprises a deflection circuit, and a variable voltage source coupled to said deflection circuit.

3. An oscillation generator according to claim 2, wherein said variable voltage source comprises a variable signal source, whereby signal frequency modulated oscillations are generated.

4. An oscillation generator according to claim 1, wherein said means for coupling said delay device includes an amplifier.

5. An oscillation generator according to claim 1, wherein said means for coupling said delay device includes an attenuation equalizer.

6. An oscillation generator according to claim 1, wherein said means for controlling said beam comprises a deflection circuit, frequency discriminator means for producing voltages corresponding to the departure of said oscillation generator from a predetermined frequency and means for applying said voltages to said deflection circuit.

7. A variable frequency oscillation generator comprising a cathode ray tube including an electron gun to produce a cathode ray beam, a control grid positioned in the path of said beam, a set of deflecting plates and a target electrode comprising a helical coil and an adjacent capacitive plate forming a delay line positioned in the path of said beam, a resistor coupled between one end of said coil and said capacitive element to provide characteristic impedance termination for said line, a coupling network comprising a fixed delay device, an attenuation equalizer and a vacuum tube amplifier, coupled between the other end of said coil and said control grid to provide a feedback circuit and means for coupling a modulating frequency variable voltage source to said deflecting plates.

ALBERT S. HARRIS.

References Cited in the file of this patent

UNITED STATES PATENTS

| Number | Name | Date |
|---|---|---|
| 2,254,036 | Gray | Aug. 26, 1941 |
| 2,265,145 | Clarke | Dec. 9, 1941 |
| 2,290,587 | Goldstine | July 21, 1942 |
| 2,456,466 | Sunstein | Dec. 14, 1948 |